(12) United States Patent
Müsch

(10) Patent No.: US 11,196,416 B2
(45) Date of Patent: Dec. 7, 2021

(54) INDUCTIVE PROXIMITY SWITCH

(71) Applicant: Renesas Electronics America Inc., Milpitas, CA (US)

(72) Inventor: Erhard Müsch, Werne (DE)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 16/647,845

(22) PCT Filed: Sep. 27, 2018

(86) PCT No.: PCT/EP2018/076235
§ 371 (c)(1),
(2) Date: Mar. 16, 2020

(87) PCT Pub. No.: WO2019/063679
PCT Pub. Date: Apr. 4, 2019

(65) Prior Publication Data
US 2020/0287541 A1 Sep. 10, 2020

(30) Foreign Application Priority Data
Sep. 27, 2017 (EP) .................................... 17193544

(51) Int. Cl.
*H03K 17/95* (2006.01)
*H05K 1/16* (2006.01)

(52) U.S. Cl.
CPC ....... *H03K 17/9505* (2013.01); *H03K 17/954* (2013.01); *H05K 1/165* (2013.01);
(Continued)

(58) Field of Classification Search
CPC .................. H03K 17/9505; H03K 17/954
(Continued)

(56) References Cited

U.S. PATENT DOCUMENTS

| 6,984,975 B2 * | 1/2006 | Aruga .................... G01D 5/204 |
| | | 324/207.17 |
| 2007/0001666 A1 * | 1/2007 | Lee ....................... G01D 5/2053 |
| | | 324/207.15 |

(Continued)

FOREIGN PATENT DOCUMENTS

WO 84/02789 A1 7/1984

OTHER PUBLICATIONS

International Search Report and Written Opinion for PCT/EP2018/076235, dated Dec. 20, 2018, pp. 1-10.

*Primary Examiner* — Tomi Skibinski
(74) *Attorney, Agent, or Firm* — Haynes and Boone, LLP

(57) ABSTRACT

The invention relates to an inductive proximity switch. The object of the invention to present a very simplified inductive position sensor, which can be reliably used for detecting a zero crossing of its output voltage when a target moves by will be solved by an inductive proximity switch comprising a transmitter coil, a receiver coil, an integrated circuit for excitation of the transmitter coil and a signal processing unit for processing a received signal from the receiver coil, wherein an oscillator excites a resonant circuit comprising the transmitter coil and a parallel capacitor for inducing a voltage in the receiver coil, wherein the receiver coil comprises two symmetrical segments with opposite orientation that are connected in series, wherein the transmitter coil surrounds the segments of the receiver coil or the transmitter coil is surrounded by the segments of the receiver coil.

12 Claims, 3 Drawing Sheets

Figure 1:
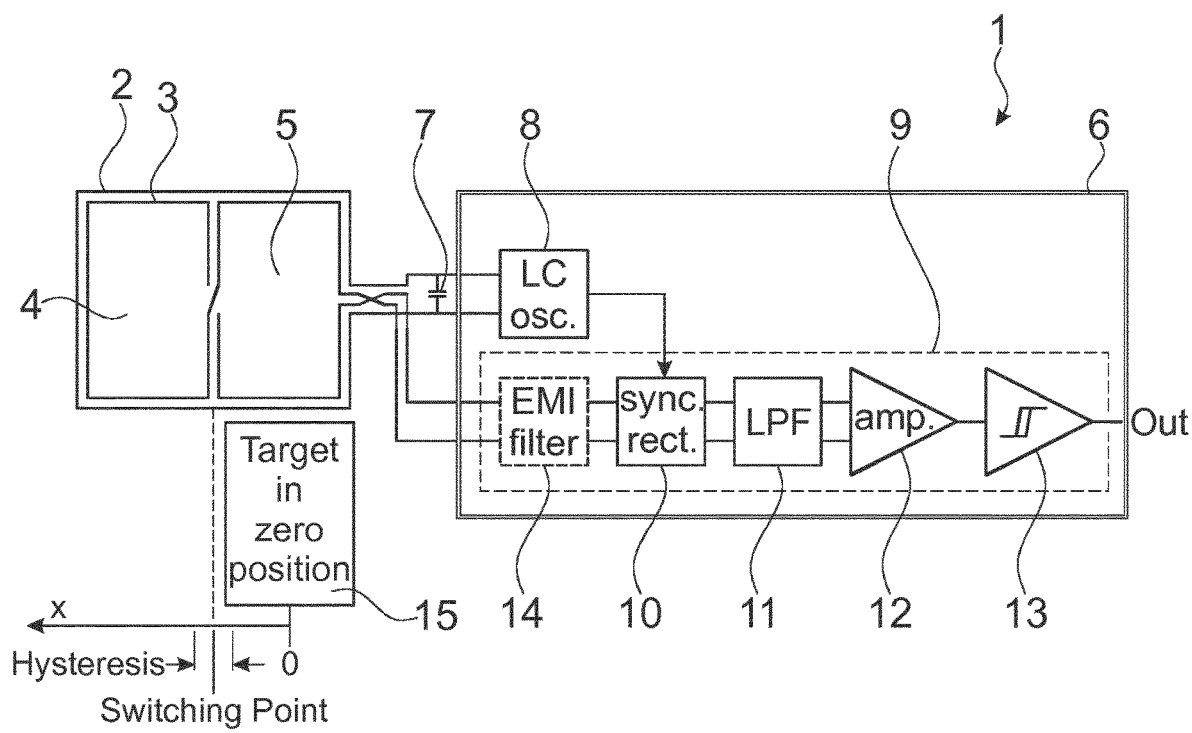

(52) U.S. Cl.
CPC .............. *H03K 2217/96072* (2013.01); *H05K 2201/10151* (2013.01)

(58) Field of Classification Search
USPC .................................................. 324/207.13
See application file for complete search history.

(56) References Cited

U.S. PATENT DOCUMENTS

2007/0046299 A1* 3/2007 Hargreaves ........ G01R 27/2605
324/678
2009/0243601 A1* 10/2009 Feldtkeller ......... H03K 17/9505
324/207.26

* cited by examiner

INDUCTIVE PROXIMITY SWITCH

RELATED APPLICATIONS

This application is a 371 National Stage of International Patent Application No. PCT/EP2018/076235, entitled "INDUCTIVE PROXIMITY SWITCH" filed on 27 Sep. 2018, which claims priority to European Patent Application No. 17193544.8 entitled "INDUCTIVE PROXIMITY SWITCH" filed on 27 Sep. 2017, both of which are herein incorporated by reference in their entirety.

The invention relates to an inductive proximity switch.

A proximity sensor is a sensor that is able to detect the presence of nearby objects without any physical contact.

A proximity sensor often emits an electromagnetic field or a beam of electromagnetic radiation (infrared, for instance), and looks for changes in the field or return signal. The object being sensed is often referred to as the proximity sensor's target. Different proximity sensor targets demand different sensors. For example, a capacitive proximity sensor or photoelectric sensor might be suitable for a plastic target; an inductive proximity sensor always requires a metal target.

Proximity sensors can have a high reliability and long functional life because of the absence of mechanical parts and lack of physical contact between the sensor and the sensed object.

In general, an inductive proximity sensor belongs to the category of non-contact electronic proximity sensor. It is used for positioning and detection of metal objects. The sensing range of an inductive switch is dependent on the type of metal being detected.

Since the output of an inductive sensor has two possible states, an inductive sensor is sometimes referred to as an inductive proximity switch. Nevertheless, the sensor signal itself is an analog signal with an infinite number of states.

The commonly used principles for proximity detection are the assessment of either frequency shift (in case of a ferro-magnetic target), flux guide or damping (in case of dominant generation of eddy currents) of a resonant circuit.

It is an objective of the present invention to present a very simplified inductive position sensor, which can be reliably used for detecting a zero crossing of its output voltage when a target moves by.

The objective of the invention will be solved by an inductive proximity switch comprising a transmitter coil, a receiver coil, a circuit for excitation of the transmitter coil and a signal processing unit for processing a received signal from the receiver coil, wherein an oscillator excites the transmitter coil for inducing a voltage in the receiver coil, wherein the receiver coil comprises two symmetrical segments with opposite orientation that are connected in series, wherein the transmitter coil surrounds the segments of the receiver coil or the transmitter coil is surrounded by the segments of the receiver coil.

The inductive proximity switch comprises a transmitter coil and a receiver coil, typically but not necessarily realized as copper traces on a printed circuit board, and a circuit for excitation of the transmitter coil and a signal processing unit for processing the received signal from the receiver coil when a target is detected. An electrically conductive (metal) target has to be attached to the object to be detected. In order to detect the presence or position of an electrically conductive target, the target has to cover the sensor coils in close distance while moving. The circuit can be an integrated circuit (IC) or it can be realized using discrete (standard) components as well.

In an embodiment of the inventive proximity switch, the transmitter coil is part of a resonant circuit, which comprises also a parallel capacitor.

An oscillator advantageously excites the resonant circuit comprising the transmitter coil and the parallel capacitor on its resonant frequency, thus generating high current in the transmitter coil while providing only low drive current. The alternating current (AC) in the transmitter coil generates an alternating magnetic field, which induces a voltage in the receiver coil. The receiver coil comprises of two symmetrical segments with opposite orientation that are connected in series. As long as no target is present, the induced voltages in these two segments have the same amplitude but opposite sign, thus summing up to zero voltage.

When a conductive target gets near to the sensor, eddy currents will be induced. The eddy currents (mainly) generate a counter magnetic field that reduces the total flux in the transmitter and receiver coil underneath the target. As a consequence the AC voltage induced in the region of the receiver coil close to the target will be reduced. In case the target does not cover identical areas of the two receiver coil segments a voltage can be measured on the receiver coil terminals according to the sign of the segment with smaller target coverage.

The shape of the target does not have to be rectangular, but it is advantageous to give it a height somewhat greater than the transmitter coil and a width similar to one segment of the receiver coil.

In an embodiment of the inventive inductive proximity switch, the transmitter coil and the receiver coil have a rectangular shape. This configuration yields the highest inductance of the transmitter coil and the maximum induced voltage in the receiver coil for given outer dimensions.

In a further embodiment of the inventive inductive proximity switch, the receiver coil has a sinusoidal, trapezoidal, triangular or any random geometrical shape. Hence, any other geometry especially of the receiver coil is possible. Basically, for the fundamental functioning of the inventive proximity switch, the shape of transmitter and receiver coils does not matter at all, as long as it is symmetrical. But even unsymmetrical shapes are possible, but lead to a switching point that varies with the air gap. The air gap is defined as the distance between the coils and the target. As mentioned before the rectangular shape of both transmitter and receiver coils yield the best performance in terms of electrical signals for given outline dimensions.

In a preferred embodiment of the inventive inductive proximity switch, the two segments of the receiver coil have a symmetrical shape. A symmetrical shape of the two receiver coil segments leads to a switching point right in the middle of the sensor, and variation of e.g. the target distance affects only the hysteresis, but not the switching point itself.

In another preferred embodiment of the inventive inductive proximity switch, the transmitter coil has multiple turns. In order to achieve higher inductance especially when the physical outline of the sensor is small, the transmitter coil may consist of multiple turns.

In a further preferred embodiment of the inventive inductive proximity switch, the receiver coil has multiple turns. Multiple turns of the receiver coil increase the signal level on its terminals.

In an embodiment of the inventive inductive proximity switch, the signal processing unit comprises an active rectifier controlled by the oscillator frequency followed by a low pass filter for converting an alternating current into a direct current value, an amplifier and a comparator for outputting a position of a target detected by the inductive proximity switch.

The signal processing unit employs an active rectifier which is controlled from the oscillator frequency and followed by a low pass filter (LPF) to convert AC amplitude into a DC value and phase relation into its sign. The LPF is not mandatory, but it is advantageous, because the configuration enables low bandwidth filtering of the AC signal and auto-tracking with its frequency, thus guarantees for very high robustness. The signal amplification may be necessary before providing it to the comparator, whereas the amplification can alternatively or additionally be performed on the AC input. The hysteresis comparator outputs the target's position left or right from the switching point, i.e. from the center of the sensor. The hysteresis is advantageous because it avoids multiple switching caused by noise when the target's position is right at the switching point and further keeps the position information even after the target has moved outside the sensor region.

In a further embodiment of the inventive inductive proximity switch, the signal processing unit comprises a low pass or band pass EMI filter. The EMI filter reduces input noise outside the signal band.

In a very preferred embodiment of the inventive inductive proximity switch, the inductive proximity switch comprises a target detection coil and means for signal processing of additional received signals by the target detection coil. The additional receiver coil formed as a target detection coil is used to identify the presence of the target, especially to solve the possible ambiguity of target position detection after turning the power supply on. The receiver coil outputs the same signal (0 V) in case the target is right in the center of the sensor and when there is no target present. Once the sensor has switched, the position is kept under all conditions (due to the hysteresis mentioned earlier), as long as power supply is present. But for some applications it may be necessary to identify a missing target right after power-on.

In another preferred embodiment of the inventive inductive proximity switch, the target detection coil comprises three segments, a center segment and two side segments, connected in series, whereas an area of the center segment is the sum of the areas covered by the two side segments. The additional target detection coil comprises three segments connected in series. The area of the center segment should be the sum of the areas of the two side segments. Due to its inverse orientation with respect to the side segments the total voltage on the terminals of the target detection coil sums up to zero when no target is present.

With the target in the switching position the voltage on the receiver coil terminals is zero, but the voltage on the target detection coil terminals is at its maximum. Three comparators with outputs comp1, comp2, and comp3 are used to detect whether a voltage $V_{det}$ above a positive $V_{th}$ or below a negative $V_{t1}$ threshold is present on either one of the two low pass filter outputs. If any of the comparators detects that its threshold is exceeded this indicates the presence of the target.

There is no necessity for matching between receiver coil and target detection coil, neither in height nor in width or shape. The output of the detection coil is only needed to detect whether the target is present or not when the voltage of the receiver coil lies between an upper and a lower threshold of the hysteresis comparator.

In a further embodiment of the inventive inductive proximity switch, the two side segments are identically sized. Such a topology provides the highest voltage level of the target detection coil in the switching point, thus giving optimal noise margin and robustness.

The invention will be explained in more detail using exemplary embodiments.

The appended drawings show

Figure 2:
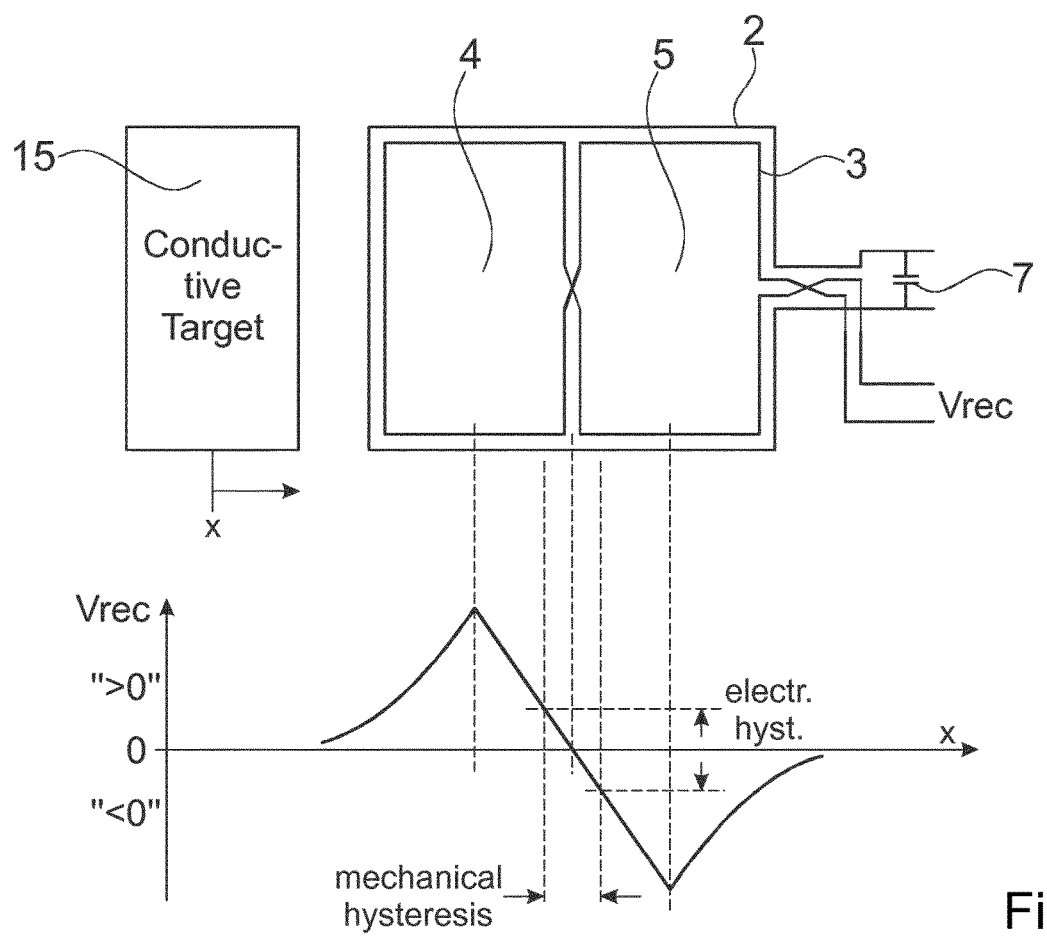
Figure 3:
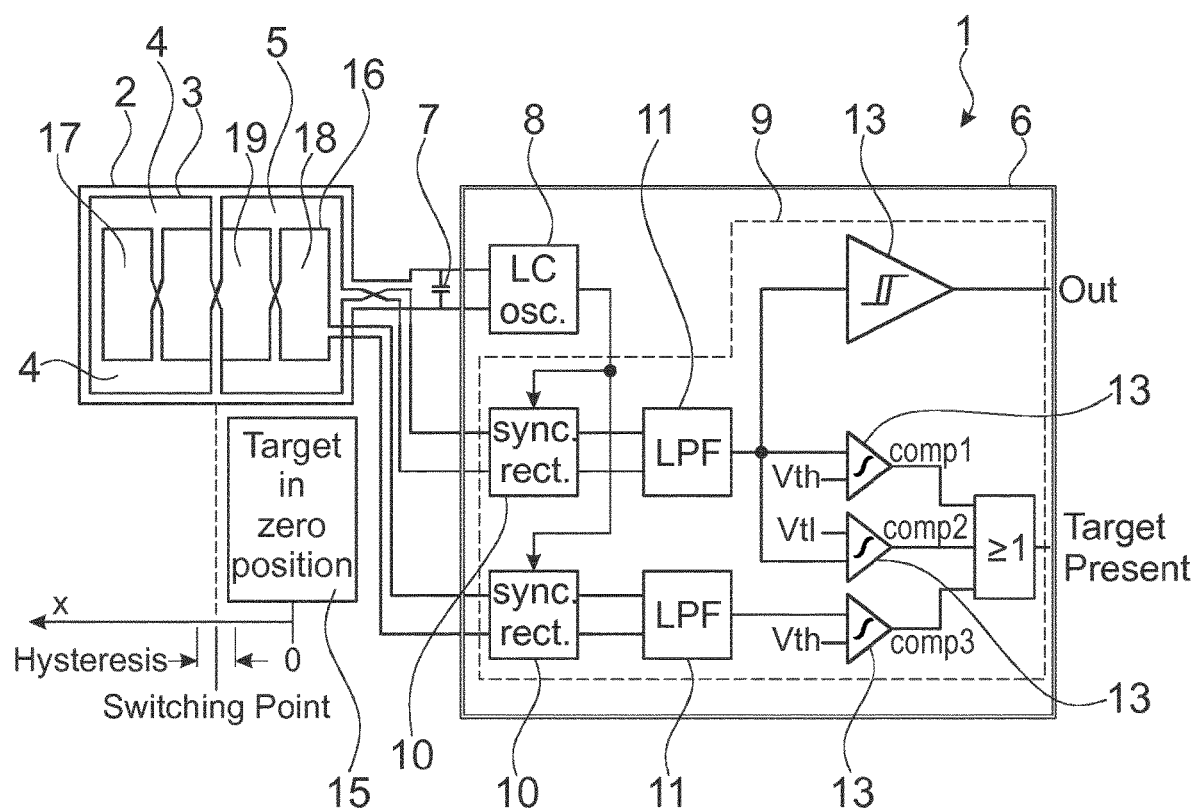
Figure 4:
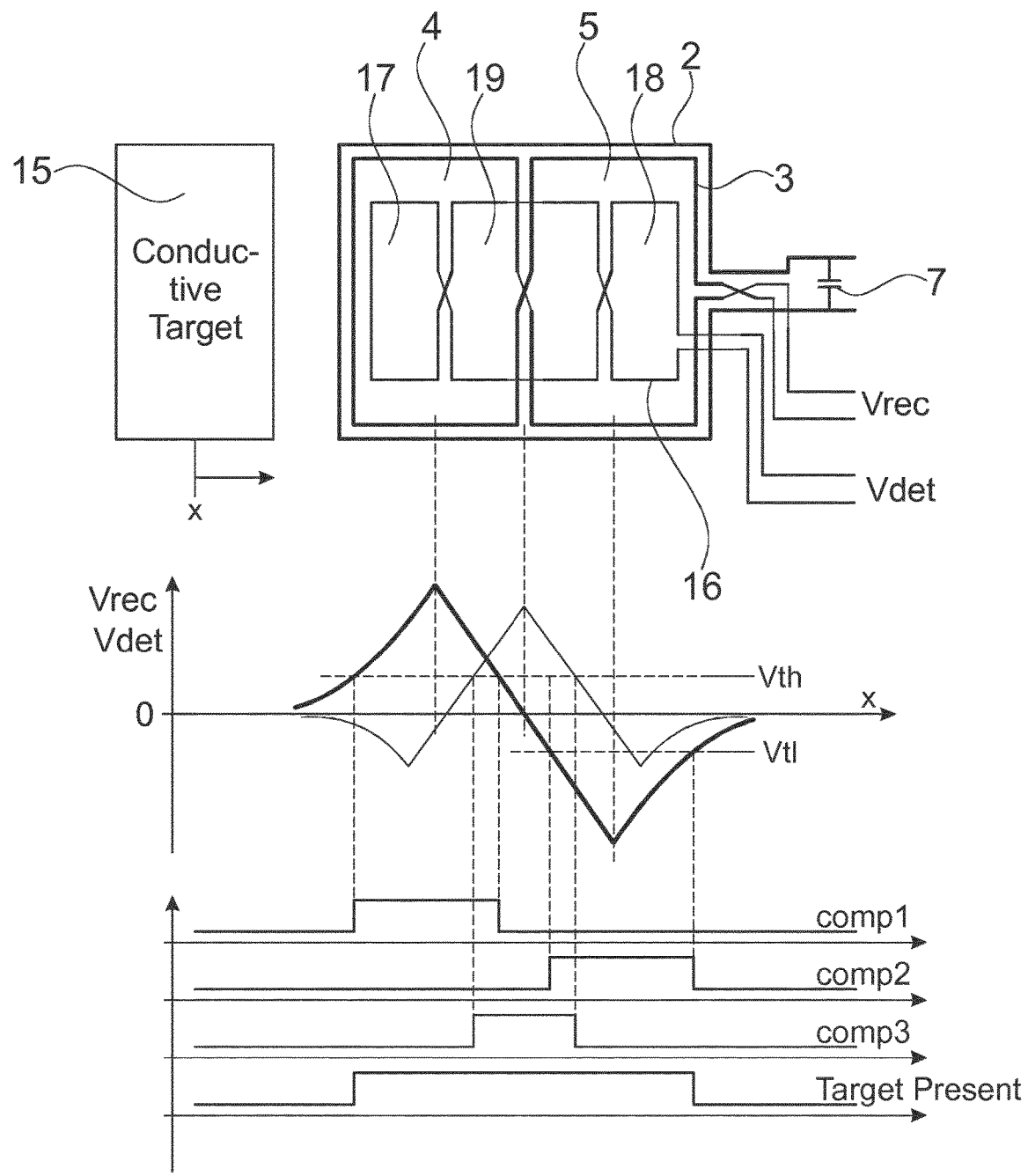

FIG. 1 Basic structure of the inventive inductive proximity switch;

FIG. 2 Receiver voltage $V_{rec}$ as a function of target position x;

FIG. 3 Additional target detection coil to identify presence of the target;

FIG. 4 Voltages on receiver coil and target detection coil as a function of target position.

FIG. 1 shows the basic structure of the inventive inductive proximity switch 1. The sensor 1 comprises a transmitter coil 2 and a receiver coil 3, typically but not necessarily realized as copper traces on a printed circuit board (PCB) and an IC 6 for excitation of the transmitter coil 2 and a signal processing unit 9 for processing the received signal from the receiver coil 3. An electrically conductive (metal) target 15 is attached to the object to be detected. In FIG. 1 the target 15 is shown underneath the sensor coils 2, 3 for better visualization. Actually it covers the sensor coils 2, 3 in close distance while moving.

An oscillator 8 advantageously excites the resonant circuit comprising the transmitter coil 2 and a parallel capacitor 7 on its resonant frequency, thus generating high current in the transmitter while providing only low drive current. The AC current in the transmitter coil 2 generates an alternating magnetic field, which induces a voltage in the receiver coil 3. The receiver coil 3 comprises two symmetrical segments 4, 5 with opposite orientation that are connected in series. As long as no target 15 is present, the induced voltages in these two segments 4, 5 have the same amplitude but opposite sign, thus summing up to zero voltage.

When a conductive target 15 gets near to the sensor 1, eddy currents will be induced, generating a counter magnetic field that reduces the total flux in the transmitter and receiver coil underneath the target. As a consequence the AC voltage induced in the region of the receiver coil 3 close to the target 15 will be reduced. In case the target 15 does not cover identical areas of the two receiver coil segments 4, 5 a voltage can be measured on the coil terminals according to the sign of the segment with smaller target coverage.

In FIG. 1 the shape of transmitter 2 and receiver coils 3 is rectangular. This configuration yields the highest inductance of the transmitter coil 2 and the maximum induced voltage in the receiver coil 3 for given outer dimensions. Any other geometry especially of the receiver coil 3 is possible, e.g. sinusoidal, trapezoidal, or triangular.

A symmetrical shape of the two receiver coil segments 4, 5 leads to a switching point right in the middle of the sensor, and variation of e.g. the target distance affects only the hysteresis, but not the switching point itself.

In order to achieve higher inductance especially when the physical outline of the sensor is small, the transmitter coil 2 may comprise multiple turns. Multiple turns of the receiver coil 3 increase the signal level on its terminals.

The shape of the target 15 also does not have to be rectangular, but it is advantageous to give it a height somewhat greater than the transmitter coil 2 and a width similar to one segment of the receiver coil 3.

The signal processing unit 9 of the receiver voltage can be realized as shown in FIG. 1: An optional low pass 11 or band pass EMI filter 14 reduces the input noise outside the signal band. Employing an active rectifier controlled from the oscillator frequency followed by a low pass filter 11 (LPF)

is advantageous, even though not mandatory, to convert AC amplitude into a DC value and phase relation into its sign. The configuration enables low bandwidth filtering of the AC signal and auto-tracking with its frequency, thus leads to very high robustness. Signal amplification may be necessary before providing it to a comparator 13. The amplification can alternatively or additionally be performed on the AC input. Furthermore, a hysteresis comparator outputs the target's position left or right from the switching point, i.e. from the center of the sensor. The hysteresis is advantageous because it avoids multiple switching caused by noise when the target's position is right at the switching point and further keeps the position information even after the target has moved outside the sensor region.

FIG. 2 shows the relative receiver voltage as a function of target position, assuming that the target has the same width as a single receiver coil segment 4, 5. The "sign" of the voltage represents the AC phase relation (0° or 180°) with respect to the transmitter coil 2. It is also the sign of the voltage behind the synchronous rectifier.

As can be seen from FIG. 2 the receiver output voltage is the same with the target right in the center of the sensor and no target being present. After the first switching event the ambiguity is solved, but for some applications it may be necessary to distinguish between these two conditions e.g. right after applying power supply to the device.

Therefore, FIG. 3 shows the system of FIG. 1 extended by an additional receiver coil 16, also called target detection coil 16, and the circuitry to identify presence of the target. Optional EMI filters and amplifiers are not shown.

The additional "target detection coil" comprises three segments connected in series. The area of the center segment 19 should be the sum of the areas of the two, preferably identically sized, side segments 17, 18. Due to its inverse orientation with respect to the side segments 17, 18 the total voltage on the terminals of the detection coil sums up to zero when no target is present.

With the target 15 in the switching position the voltage on the receiver coil terminals is zero, but the voltage on the detection coil terminals is at its maximum. Three comparators with outputs comp1, comp2, and comp3 are used to detect whether a voltage above a positive or below a negative threshold is present on either one of the two low pass filter outputs. If any of the comparators detects that its threshold is exceeded this indicates presence of the target.

There is no necessity for matching between receiver coil 3 and target detection coil 16, neither in height nor in width or shape. The output of the detection coil 16 is only needed to detect whether the target 15 is present or not when the voltage of the receiver coil lies between upper and lower threshold of the hysteresis comparator.

FIG. 4 shows the terminal voltages of receiver coil 3 and target detection coil 16 as a function of target position, furthermore the related comparator outputs and the output of the 3-input OR gate which indicates presence of the target.

For simplification the two threshold voltages $V_{th}$ and $V_{t1}$ can be the same as the hysteresis thresholds for position detection. Thus the hysteresis comparator can be replaced with an RS flip-flop driven from comp1 and comp2. Furthermore, the threshold voltage of comparator 3 may, but not necessarily has to be the same as of comparator 1 (or comparator 2 in case the signal is inverted from what is assumed in FIG. 4).

Inductive Proximity Switch

LIST OF REFERENCE SIGNS 1 inductive proximity switch
2 transmitter coil
3 receiver coil
4 first segment of the receiver coil
5 second segment of the receiver coil
6 integrated circuit
7 parallel capacitor
8 oscillator
9 signal processing unit
10 rectifier
11 low pass filter
12 amplifier
13 comparator
14 EMI filter
15 conductive target
16 target detection coil
17 first side segment of the target detection coil
18 second side segment of the target detection coil
19 center segment of the target detection coil

The invention claimed is:

1. An inductive proximity switch, comprising:
a transmitter coil,
a receiver coil, the receiver coil comprising two symmetrical segments with opposite orientation that are connected in series,
a circuit configured to excite the transmitter coil,
a signal processing unit coupled to receive a received signal from the receiver coil and configured to process the received signal and provide an indication of whether the position of a target is to one side or the other of a switching point between the two symmetrical segments,
wherein the circuit includes an oscillator configured to excite the transmitter coil, thereby inducing a voltage in the receiver coil,
wherein the transmitter coil surrounds the segments of the receiver coil or the transmitter coil is surrounded by the segments of the receiver coil, and
wherein the signal processing unit includes a hysteresis comparator that provides the indication of the position of the target relative to the switching point.

2. The inductive proximity switch according to claim 1, wherein the transmitter coil is part of a resonant circuit, which comprises also a parallel capacitor.

3. The inductive proximity switch according to claim 1, wherein the transmitter coil and the receiver coil have a rectangular shape.

4. The inductive proximity switch according to claim 1, wherein the receiver coil has a sinusoidal, trapezoidal, triangular or random geometrical shape.

5. The inductive proximity switch according to claim 1, wherein the two segments of the receiver coil have a symmetrical shape.

6. The inductive proximity switch according to claim 1, wherein the transmitter coil has multiple turns.

7. The inductive proximity switch according to claim 1, wherein the receiver coil has multiple turns.

8. The inductive proximity switch according to claim 7, wherein the signal processing unit comprises a low pass or band pass EMI filter.

9. The inductive proximity switch according to claim 1, wherein the signal processing unit comprises an active rectifier controlled by the oscillator frequency followed by a low pass filter for converting an alternating current into a direct current value, an amplifier and the hysteresis comparator for outputting a position of a target detected by the inductive proximity switch.

10. The inductive proximity switch according to claim 1, wherein the inductive proximity switch further comprises a target detection coil and means for signal processing of additional received signals by the target detection coil.

11. The inductive proximity switch according to claim 10, wherein the target detection coil comprises three segments, a center segment and two side segments, connected in series, whereas an area of the center segment is the sum of the areas covered by the two side segments.

12. The inductive proximity switch according to claim 11, wherein the two side segments are identically sized.

* * * * *